US008045731B2

(12) United States Patent
Aoki et al.

(10) Patent No.: US 8,045,731 B2

(45) Date of Patent: Oct. 25, 2011

(54) SOUND QUALITY ADJUSTMENT DEVICE

(75) Inventors: Ryotaro Aoki, Hamamatsu (JP); Hitoshi Akiyama, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 1211 days.

(21) Appl. No.: 11/442,494

(22) Filed: May 25, 2006

(65) Prior Publication Data

US 2006/0274903 A1 Dec. 7, 2006

(30) Foreign Application Priority Data

Jun. 6, 2005 (JP) ................................ 2005-166222
Jun. 6, 2005 (JP) ................................ 2005-166228

(51) Int. Cl.
*H03G 5/00* (2006.01)
*H03G 3/00* (2006.01)

(52) U.S. Cl. ............................ 381/102; 381/98; 381/61

(58) Field of Classification Search .................... 381/66, 381/98, 102, 103, 104, 106, 107, 119, 61
See application file for complete search history.

(56) References Cited

U.S. PATENT DOCUMENTS

| | | | |
|---|---|---|---|
| 3,539,725 A | 11/1970 | Hellwarth et al. | |
| 3,555,192 A * | 1/1971 | Hymer | 381/110 |
| 5,172,358 A * | 12/1992 | Kimura | 369/47.26 |
| 7,013,013 B2 * | 3/2006 | Takei | 381/307 |
| 7,149,314 B2 * | 12/2006 | Dahl et al. | 381/63 |
| 2002/0076072 A1 * | 6/2002 | Cornelisse | 381/312 |

FOREIGN PATENT DOCUMENTS

| | | |
|---|---|---|
| JP | 49-5371 | 2/1974 |
| JP | 4319807 | 11/1992 |
| JP | 5029854 | 2/1993 |
| JP | 9148862 | 6/1997 |
| JP | 10051253 | 2/1998 |
| JP | 10303666 | 11/1998 |
| JP | 11261356 | 9/1999 |
| JP | 2000276155 | 10/2000 |
| JP | 2000287155 | 10/2000 |
| JP | 3206271 | 7/2001 |
| JP | 2001238300 | 8/2001 |
| JP | 2003255951 | 9/2003 |
| JP | 2003299181 | 10/2003 |
| JP | 2006-340328 | 12/2006 |

OTHER PUBLICATIONS

Japanese Patent Office: Notice of Reason for Rejection, Patent Application No. 2005-166228 (dated Apr. 8, 2008; 3 pgs.).
Japanese Patent Office: Notice of Reason for Refusal, Patent Application No. 2005-166222 (dated Apr. 22, 2008; 3 pgs.).

* cited by examiner

*Primary Examiner* — Xu Mei
(74) *Attorney, Agent, or Firm* — Pillsbury Winthrop Shaw Pittman LLP

(57) ABSTRACT

LPF and HPF extract bass and treble ranges, respectively, from an input sound signal, and bass and treble boost circuits perform dynamic range expansion/contraction on the extracted bass- and treble-range sound signals in accordance with input levels of the sound signals. The input sound signal and the sound signals output from the boost circuits are added together. There may also be provided coefficient calculation sections for calculating filter coefficients on the basis of the levels of the sound signals extracted by the LPF and HPF. In this case, the bass and treble boost sections perform, in accordance with the filter coefficients calculated by the corresponding coefficient calculation sections, filter processes for increasing/decreasing the levels of the bass and treble ranges, respectively.

5 Claims, 8 Drawing Sheets

SOUND QUALITY ADJUSTMENT DEVICE

BACKGROUND OF THE INVENTION

The present invention relates to sound quality adjustment devices for various audio apparatus and television receivers.

Among examples of the sound quality adjustment devices for various audio apparatus are those disclosed in Japanese Patent Publication Nos. 3206271 and 3329050. FIG. 13 is a block diagram showing a general construction of the sound quality adjustment devices disclosed in the above-identified Nos. 3206271 and 3329050 publications. In the sound quality adjustment device of FIG. 13, input audio or sound signals of two channels, i.e. left (L) and right (R) channels, are attenuated by attenuators 100*a* and 100*b*, respectively, and then levels of particular frequency bands of these two-channel input sound signals are enhanced or boosted by tone filters 101*a* and 101*b*Then, the thus-boosted sound signals are determined by a level determination section 102, and filter coefficients of the tone filters 101*a* and 101*b* are varied by a boost amount calculation section 103, on the basis of the results of the level determination, so as to achieve desired sound quality adjustment.

However, with the conventional sound quality adjustment device of FIG. 13, where the level boost amounts of the tone filters 101*a* and 101*b* are adjusted by feedback control based on detection of the levels of the sound signals processed by the tone filters 101*a* and 101*b*, there would arise the problem that the level boost amount adjustment is delayed relative to a rapid level variation of any of the input sound signals. Thus, when any of the input sound signals has rapidly increased in level, for example, a considerable time is required before the level boost amount is appropriately restrained through the feedback control, so that "clipping" may result due to, for example, an overflow of digital signal processing and an undesired clipping sound may be produced at connection points of the boost amount adjustment.

SUMMARY OF THE INVENTION

In view of the foregoing, it is an object of the present invention to provide an improved sound quality adjustment device capable of high-speed response to a sound signal level variation.

In order to accomplish the above-mentioned object, the present invention provides a sound quality adjustment device which, for at least one of sound signals of multiple channels, comprises: a filter circuit that extracts a sound signal of a predetermined frequency band from an input sound signal; a boost circuit that performs dynamic range expansion/contraction on the sound signal, extracted by the filter circuit, in accordance with an input level of the sound signal; and an adder that adds together the input sound signal and the sound signal outputted by the boost circuit.

By employing the feed-forward arrangement that performs the dynamic range expansion/contraction on the sound signal in accordance with the level of the sound signal extracted by the filter circuit, the present invention can rapidly respond to a variation in the sound signal level, as compared to the conventionally-known sound quality adjustment device. As a result, even when there has been a rapid increase in the input sound signal level, the present invention can effectively prevent production of an unwanted clipping sound.

Preferably, the sound quality adjustment device further comprises, for the at least one sound signal, a subtracter that subtracts the sound signal, extracted by the filter circuit, from the input sound signal. The adder adds together the subtracted input sound signal and the sound signal outputted by the boost circuit. By the provision of the subtracter that subtracts the filter-extracted sound signal from the input sound signal, the present invention can prevent a dip in the frequency band for which the sound quality adjustment is to be performed and thereby achieve smooth connection among frequency characteristics of the sound.

Preferably, the sound quality adjustment device further comprises, for the at least one sound signal, a decay processing circuit provided, between the filter circuit and the boost circuit, for gradually decaying or attenuating the output level in accordance with lowering of the level of the sound signal extracted by the filter circuit. By the provision of the decay processing circuit between the filter circuit and the boost circuit, the present invention can restrain a too-rapid variation in the level of the sound signal output from the adjustment device, to thereby give a natural auditory sensation to an audience.

Preferably, the sound quality adjustment device further comprises a normalization processing circuit that performs dynamic range expansion/contraction on the sound signal of each of the channels using a same or common gain coefficient corresponding to the greatest level of the sound signals of the multiple channels. With such an arrangement, the present invention can effectively avoid a sound from becoming hard to hear when the sound volume is small while eliminating the inconvenience that the sound becomes too loud when the sound volume is great. Further, the present invention can reduce a difference in sound volume due to differences between audio sources or the like and thereby eliminate the need for frequent sound volume manipulation by the user.

According to another aspect of the present invention, there is provided a sound quality adjustment device, which, for at least one of sound signals of multiple channels, comprises: an extraction section that extracts a sound signal of a predetermined frequency band from an input sound signal; a coefficient calculation section that calculates a filter coefficient on the basis of a level of the sound signal extracted by the extraction section; and a filter processing section that, in accordance with the filter coefficient calculated by the coefficient calculation section, performs a filter process for increasing/decreasing the level of the sound signal of the predetermined frequency band of the input sound signal.

By employing the feed-forward arrangement for changing in real time the filter coefficient of the filter processing section in accordance with the level of the sound signal extracted by the extraction section, the present invention can rapidly respond to a variation in the sound signal level, as compared to the conventionally-known sound quality adjustment device. As a result, even when there has been a rapid increase in the input sound signal level, the present invention can effectively prevent production of an unwanted clipping sound.

Preferably, the sound quality adjustment further comprises, for the at least one sound signal, a decay processing section provided between the extraction section and the filter processing section, the decay processing section gradually attenuating an output level in accordance with lowering of the level of the sound signal extracted by the extraction section. By the provision of the decay processing circuit between the filter circuit and the boost circuit, the present invention can restrain a too-rapid variation in the level of the sound signal output from the adjustment device, to thereby give a natural auditory sensation to the audience.

The following will describe embodiments of the present invention, but it should be appreciated that the present invention is not limited to the described embodiments and various modifications of the invention are possible without departing from the basic principles. The scope of the present invention is therefore to be determined solely by the appended claims.

BRIEF DESCRIPTION OF THE DRAWINGS

For better understanding of the objects and other features of the present invention, its preferred embodiments will be described hereinbelow in greater detail with reference to the accompanying drawings, in which.

DETAILED DESCRIPTION OF THE INVENTION

First Embodiment

Figure 1:
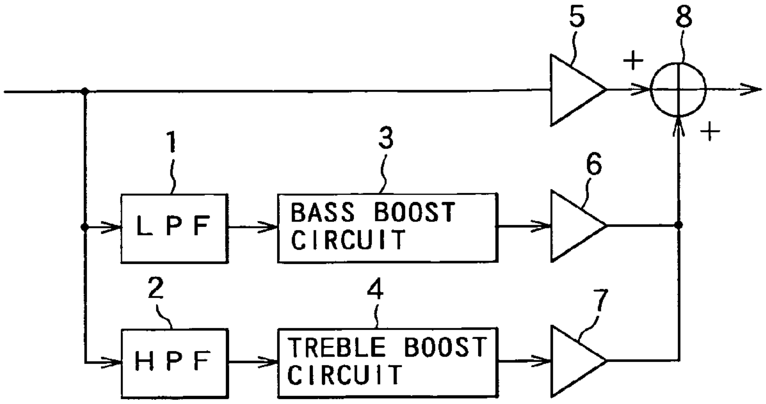
FIG. 1 is a block diagram showing a general setup of a sound quality adjustment device in accordance with a first embodiment of the present invention.

FIG. 1 is a block diagram showing a general setup of a sound quality adjustment device in accordance with a first embodiment of the present invention. This sound quality adjustment device includes a low-pass filter (hereinafter referred to as "LPF") 1, a high-pass filter (hereinafter referred to as "HPF") 2, a bass boost circuit 3, a treble boost circuit 4, multipliers 5, 6 and 7, and an adder 8.

Behavior of the sound quality adjustment device according to the first embodiment will be described. The LPF 1, which is in the form of an IIR (Infinite Impulse Response) filter, extracts, from an input sound signal (first sound signal), a second sound signal of a bass range lower in frequency than, for example, several hundred Hz. The bass boost circuit 3 performs dynamic range expansion/contraction on the second sound signal, extracted by the LPF 1, in accordance with the input level of the second sound signal.

Figure 2:
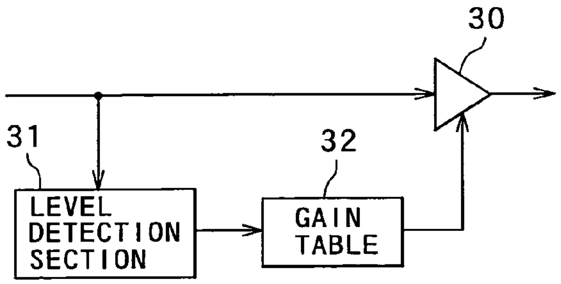
FIG. 2 is a block diagram showing an example construction of a bass boost circuit in the first embodiment.

FIG. 2 is a block diagram showing a construction of the bass boost circuit 3, which includes an amplifier 30, level detection section 31 and gain table 32. The level detection section 31 detects the level of the second sound signal output from the LPF 1. The gain table 32 has prestored therein input sound signal levels and gain coefficients of the amplifier 30 in association with each other. Particular gain coefficient corresponding to the level detected by the level detection section 31 is read out from the gain table 32 and supplied to the amplifier 30. In the relationships between the input levels and the gain coefficients stored in the gain table 32, there are incorporated linear-log conversion, ratio calculation, log-linear conversion processes. Thus, each value converted via the gain table 32 can be set directly as a gain of the input data. The amplifier 30 multiplies the second sound signal, output from the LPF 1, by the gain coefficient output from the gain table 32, to thereby output the multiplied second sound signal. In this way, the instant embodiment can perform dynamic expansion/compression in accordance with the level of the sound signal.

The HPF 2, which is also in the form of an IIR filter, extracts, from the input first sound signal, a third sound signal of a treble range higher in frequency than, for example, several kHz. The treble boost circuit 4 performs dynamic range expansion/contraction on the third sound signal, extracted by the HPF 2, in accordance with the input level of the third sound signal. Construction of the treble boost circuit 4 is similar to that of the bass boost circuit 3.

The multipliers 5, 6 and 7 multiply the first sound signal, second sound signal output from the bass boost circuit 3 and third sound signal output from the treble boost circuit 4 by respective gain coefficients, to thereby adjust the first to third sound signals to desired levels. The adder 8 adds together the first, second and third sound signals output from the multipliers 5, 6 and 7.

Figure 3:
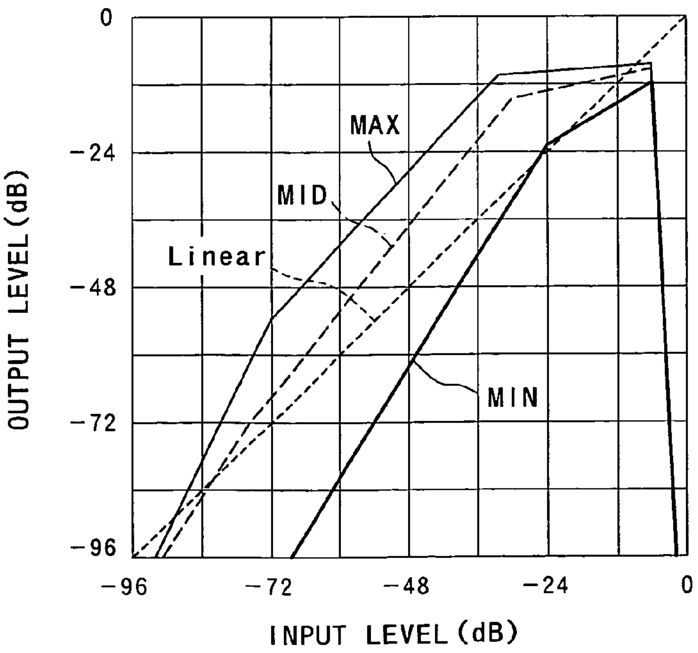
FIG. 3 is a diagram showing example input/output characteristics of the bass boost circuit in the first embodiment.

FIG. 3 shows example input/output characteristics of the bass boost circuit 3 in the first embodiment, where the horizontal axis indicates the input level of the second sound signal extracted by the LPF 1 while the vertical axis indicates the output level of the bass boost circuit 3. "linear" indicates a linear characteristic where input and output levels are at a ratio of 1:1. As shown, when the input sound is of a small volume, the gain is increased (i.e., inclination of the input/output characteristic is increased) to boost bass components of the sound, while, when the input sound is of a great volume, the gain is decreased (i.e., inclination of the input/output characteristic is decreased) to restrain the bass component enhancement or boost of the sound.

As illustrated in FIG. 3, the output level of the bass boost circuit 3 is rapidly lowered when the input level is in the neighborhood of 0 dB. The reason for rapidly lowering the output level like this is to prevent clipping of the output. Namely, in the instant embodiment of the sound quality adjustment device, where bass components present in the first sound signal and bass components having been extracted from the first sound signal and boosted by the bass boost circuit 3 are added together, there is a possibility of the output being clipped if the sound volume is great. To avoid the clipping, the instant embodiment is arranged to lower the output level of the bass boost circuit 3 when the sound volume is extremely great.

Further, as shown in FIG. 3, a plurality of different kinds of input/output characteristics of the bass boost circuit 3 may be prepared in advance (i.e., prestored in the gain table 32), such as input/output characteristics for achieving a minimum bass boost effect ("MIN"), input/output characteristics for achieving a medium bass boost effect ("MID"), and input/output characteristics for achieving a maximum bass boost effect ("MAX"). In this case, the gain table 32 includes a plurality of tables corresponding to the plurality of different kinds of input/output characteristics, and the user may select any one of the MIN, MID and MAX characteristics. Input/output characteristics of the treble boost circuit 4 may be set in a similar manner to those shown in FIG. 3.

Because the bass components, extracted from the first sound signal, are boosted by the bass boost circuit 3 and then added to the first sound signal as set forth above, the instant embodiment allows the bass-range sound volume in the overall sound volume to approach a predetermined volume level and can thereby impart the sound with "punch" even when the sound source has a small quantity of bass components. Similarly, because the treble components, extracted from the first sound signal, are boosted by the treble boost circuit 4 and then added to the first sound signal as set forth above, the instant embodiment can impart the sound with "modulation" even when the sound source has a small quantity of treble components.

Figure 13:
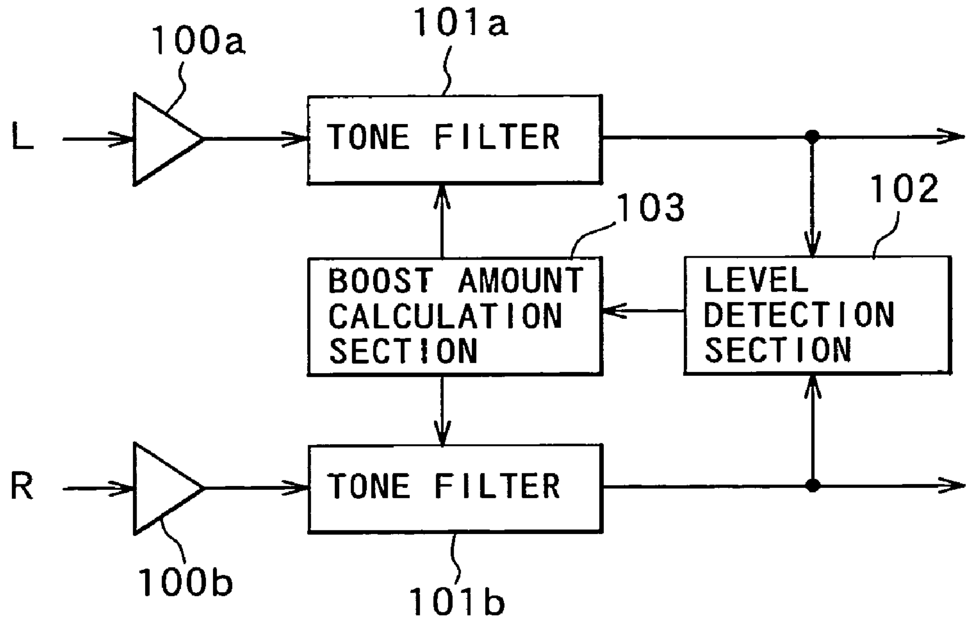
FIG. 13 is a block diagram showing a general setup of a conventionally-known sound quality adjustment device.

Further, because the instant embodiment employs feedforward arrangements for performing the dynamic range expansion/contraction of the bass and treble components in accordance with the levels of the bass and treble components extracted by the LPF 1 and HPF 2 instead of employing feedback of the levels of the sound signals having been subjected to the sound quality adjustment, it can rapidly respond to a sound signal level variation, as compared to the conventionally-known sound quality adjustment device shown in FIG. 13. As a result, even when there has been a rapid increase in the input sound signal level, the instant embodiment can promptly restrain the boosts of the bass and treble components and thereby prevent generation of an unwanted clipping sound.

Second Embodiment

Figure 4:
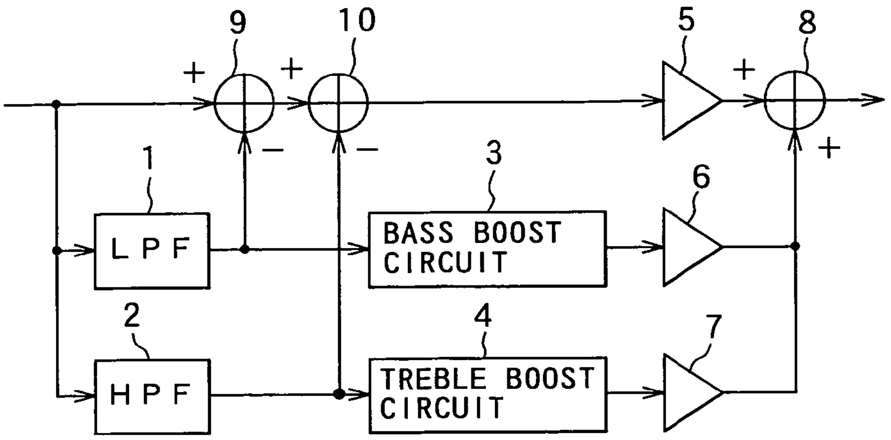
FIG. 4 is a block diagram showing a general setup of a sound quality adjustment device in accordance with a second embodiment of the present invention.

Next, a second embodiment of the present invention will be described. FIG. 4 is a block diagram of a sound quality adjustment device in accordance with the second embodiment of the present invention, where elements similar to those in FIG. 1 are indicated by the same reference numerals as in FIG. 1. The sound quality adjustment device according to the second embodiment is constructed by adding subtracters 9 and 10 to the elements of the above-described first embodiment. The subtracter 9 subtracts, from the first sound signal, the second sound signal of the bass range and outputs the first sound signal having been subjected to the subtraction (i.e., subtracted first sound signal). The subtracter 10 subtracts, from the first sound signal, the second sound signal of the treble range and outputs the first sound signal having been subjected to the subtraction (i.e., subtracted first sound signal).

Thus, the second embodiment can provide the following advantageous benefits in addition to the benefits provided by the first embodiment. With the above-described first embodiment, where the bass and treble components extracted from the first sound signal and boosted by the boost circuits 3 and 4 are added to the bass and treble components originally present in the first sound signal, unnatural dips (sound weakening) may undesirably occur in the bass and treble ranges, which would result in unsmooth connections between frequency characteristics of the sound. To avoid such an inconvenience of the first embodiment, the second embodiment is arranged in such a manner that a bass range is cut out, by the subtracter 9, from the first sound signal while a treble range is cut out, by the subtracter 10, from the first sound signal, so that the first sound signal having passed through the subtracter 10 will have only components of a midrange. Thus, it is possible to prevent bass components of the first and second sound signals from being added together and also prevent treble components of the first and third sound signals from being added together at the time of the addition by the adder 8. In this way, the second embodiment can effectively prevent dips in the bass and treble ranges and thereby achieve smooth connection among frequency characteristics of the sound.

Figure 5:
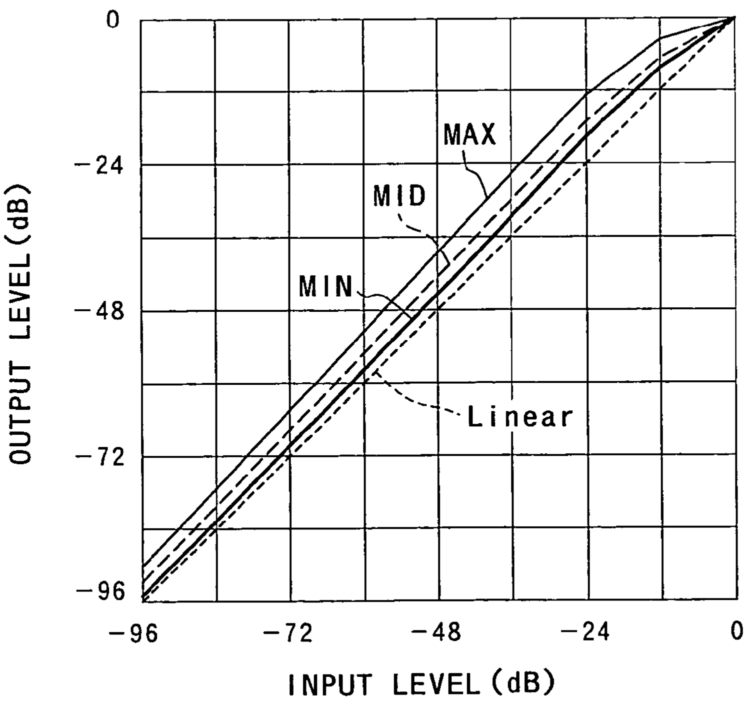
FIG. 5 is a diagram showing example input/output characteristics of a bass boost circuit in the second embodiment.

FIG. 5 shows example input/output characteristics of the bass boost circuit 3 in the second embodiment. In the second embodiment, the input/output characteristics of the bass boost circuit 3 may be set in generally the same manner as in the first embodiment. Whereas the output level of the bass boost circuit 3 in the first embodiment is rapidly lowered when the input level is in the neighborhood of 0 dB, the output level of the bass boost circuit 3 in the second embodiment need not be lowered when the input level is in the neighborhood of 0 dB because no dips may occur in the bass and treble ranges as stated above. Input/output characteristics of the treble boost circuit 4 in the second embodiment may be set in a manner similar to that of the bass boost circuit 3 shown in FIG. 5.

Third Embodiment

Figure 6:
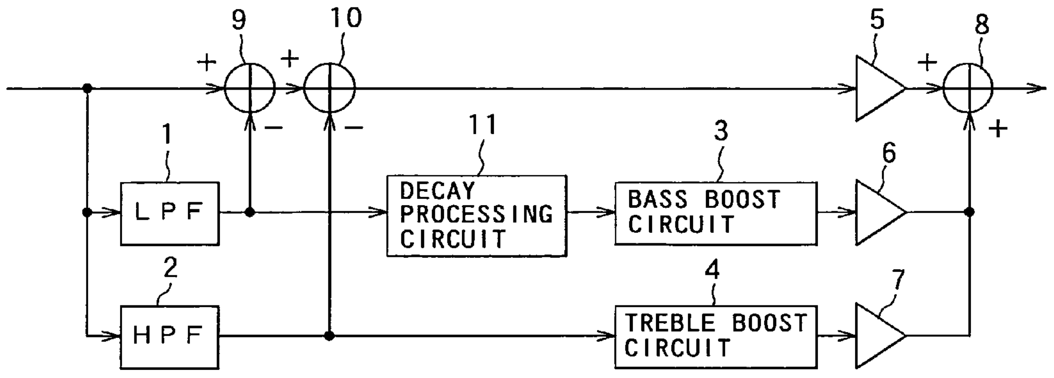
FIG. 6 is a block diagram of a sound quality adjustment device in accordance with a third embodiment of the present invention.

Next, a third embodiment of the present invention will be described. FIG. 6 is a block diagram of a sound quality adjustment device in accordance with the third embodiment of the present invention, where elements similar to those in FIG. 1 or 4 are indicated by the same reference numerals as in FIG. 1 or 4. The sound quality adjustment device according to the third embodiment is constructed by adding a decay processing circuit 11 between the LPF 1 and the bass boost circuit 3.

Figure 7:
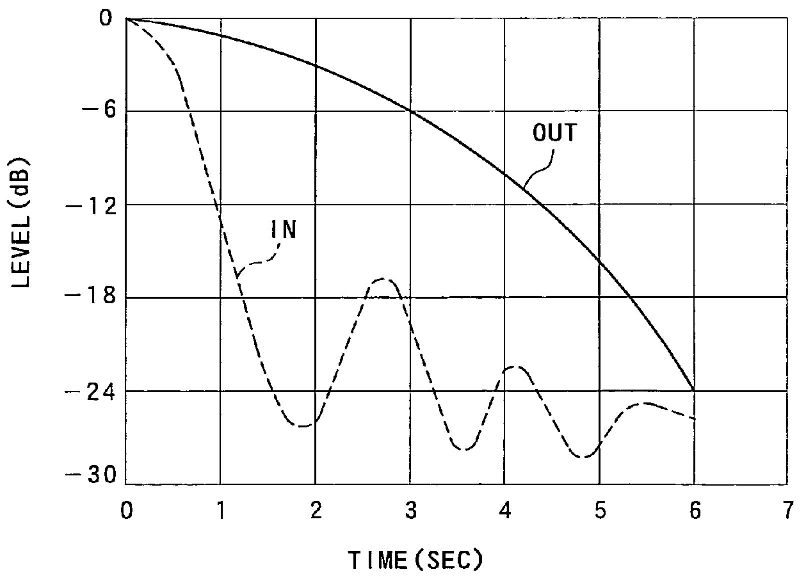
FIG. 7 is a diagram showing example input/output time characteristics of a decay processing circuit in the third embodiment.

The decay processing circuit 11 is a circuit for gradually decaying or attenuating the output level in accordance with level lowering of the second sound signal of a bass range extracted by the LPF 1. FIG. 7 shows example input/output time characteristics of the decay processing circuit 11 in the third embodiment, where the horizontal axis indicates the time while the vertical axis indicates the sound signal level. "IN" indicates the second sound signal extracted by the LPF 1, and "OUT" indicates an output signal of the decay processing circuit 11.

When an impulse sound signal IN has been input, the decay processing circuit 11 gradually attenuates the sound signal over a predetermined release time without causing the level of the output signal OUT to follow the sound signal IN that rapidly decreases in level after assuming a maximum value, as illustrated in FIG. 7. In the third embodiment, a decay process is performed where the decay rate increases nonlinearly in accordance with the passage of time. In this way, a variation in the output level is restrained immediately after an impulse-like variation has occurred in the bass range extracted by the LPF 1, and then, upon lapse of a given time, the decay of the output level is increased, so that the third embodiment can give a natural auditory sensation to an audience.

In order to realize such a decay process, the sound signal input to the decay processing circuit 11 is sampled at predetermined time intervals, and a comparison is made between a sample value at the current time and an output value at the last sampling time so that the higher of the compared two sample values is selected as an output value at the current time. Thus, when the input sound signal level increases, the latest sample value is constantly selected, so that the output level of the decay processing circuit 11 increases in accordance with the input level. However, when the input sound signal level decreases, the output value at the last sampling time is selected, in which case the value at the last sampling time is attenuated to be set as the output value at the current time. In this case, the decay rate increases with the passage of time as noted above, and the output value is used, in the level comparison at the next sampling, as the output value at the last sampling time.

As stated above, the third embodiment provided with the decay processing circuit 11 can restrain an excessive level variation of the bass range to thereby give a natural auditory sensation to the audience. Although the third embodiment has been described as including the decay processing circuit 11 provided between the LPF 1 and the bass boost circuit 3, such a decay processing circuit may also be provided between the HPF 2 and the treble boost circuit 4. Further, such a decay processing circuit may be applied to the first embodiment as well.

Further, whereas the first to third embodiments have been described only in relation to a sound signal of one channel, the present invention may be applied to sound signals of multiple channels. In such a case, the sound quality adjustment device shown in FIG. 1, 4 or 6 is provided per channel. Furthermore, the sound quality adjustment need not be performed for all of the channels; it may be performed for at least one of the channels. Where the present invention is applied, for example, to a 5.1 channel surround system, which includes a front left channel (L(i.e., Left)ch), front right channel (R(i.e., Right)ch), center channel (Cch), rear left channel (SL(i.e., Surround Left)ch), rear right channel (SR(i.e., Surround Right)ch) and sub-woofer channel (LFE(i.e., Low Frequency Effect)ch), a high sound quality adjustment effect can be achieved in the channels Lch, Rch and Cch, and thus, it is only necessary to perform the sound quality adjustment separately only for each of these three channels Lch, Rch and Cch.

The sound quality adjustment may be performed separately for each of the channels, and same or common gain coefficients may be used for these channels. In the case where common gain coefficients are used for all of the channels, the treble boost circuit 4 of each of the sound quality adjustment devices, provided in corresponding relation to the channels Lch, Rch and Cch, may detect, via the level detection section, the greatest level among the treble components of three sound signals of the channels Lch, Rch and Cch extracted by the corresponding HPFs 2, so that gain coefficients corresponding to the greatest level are read out from the gain table. Thus, in the case where the sound quality adjustment is to be performed for the three channels Lch, Rch and Cch, the same level detection circuit and gain table can be shared among the respective treble boost circuits 4 of the three channels although the sound quality adjustment device has to be provided for each of the three channels Lch, Rch and Cch, with the result that the overall circuitry size can be reduced significantly.

Fourth Embodiment

Figure 8:
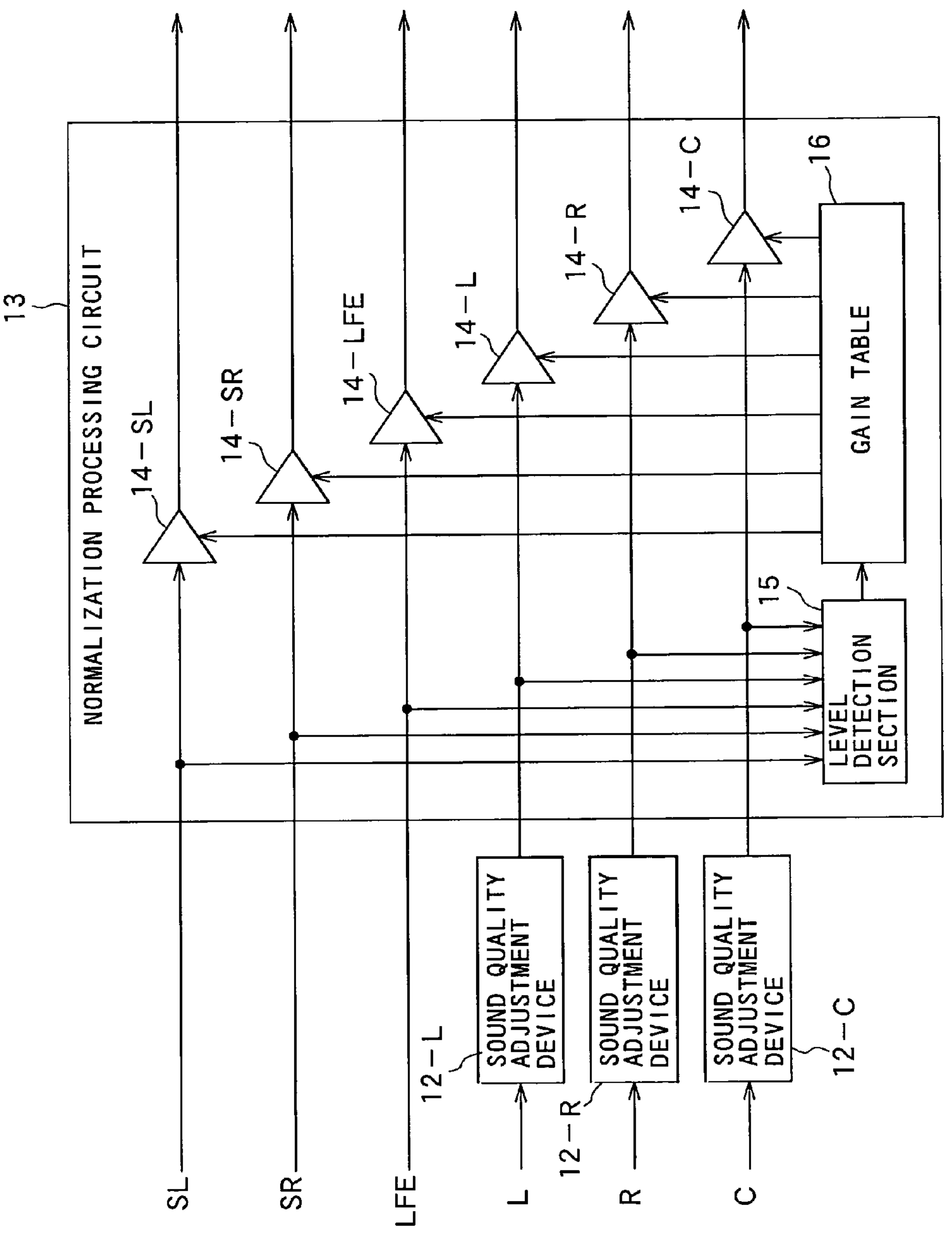
FIG. 8 is a block diagram showing a general setup of a sound quality adjustment device in accordance with a fourth embodiment of the present invention.

Next, a fourth embodiment of the present invention will be described. FIG. 8 is a block diagram of a sound quality adjustment device in accordance with the fourth embodiment of the present invention, where elements similar to those in FIG. 1, 4 or 6 are indicated by the same reference numerals as in FIG. 1, 4 or 6. The fourth embodiment is constructed as a group of sound quality adjustment devices for multiple channels, i.e. sound quality adjustment devices 12-L, 12-R and 12-C for the channels Lch, Rch and Cch. The fourth embodiment also includes a normalization processing circuit 13 for adjusting volumes of sound signals of the individual channels Lch, Rch and Cch. Each of the sound quality adjustment device 12-L, 12-R and 12-C may be constructed in the same manner as any one of the above-described first to third embodiments.

The normalization processing circuit 13 includes amplifiers 14-L, 14-R, 14-C, 14-SL, 14-SR and 14-LFE, level detection section 15, and gain table 16. The level detection section 15 detects the greatest level from among sound signals of the channels Lch; Rch and Cch having been subjected to the sound adjustment by the corresponding sound quality adjustment devices 12-L, 12-R and 12-C and sound signals of the other channels SLch, SRch and LFEch that do not pass through the sound quality adjustment devices.

The gain table 16 has prestored therein input sound signal levels and gain coefficients of the amplifiers 14-L, 14-R, 14-C, 14-SL, 14-SR and 14-LFE in association with each other. Gain coefficients corresponding to the greatest level detected by the level detection section 15 are read out from the gain table 16 and supplied to the amplifiers 14-L, 14-R, 14-C, 14-SL, 14-SR and 14-LFE. Each of the amplifiers 14-L, 14-R, 14-C, 14-SL, 14-SR or 14-LFE multiplies the sound signal of the corresponding channel Lch, Rch, Cch, SLch, SRch or LFEch by a gain coefficient output from the gain table 16, to thereby output the multiplied sound signal of the channel Lch, Rch, Cch, SLch, SRch or LFEch.

Figure 9:
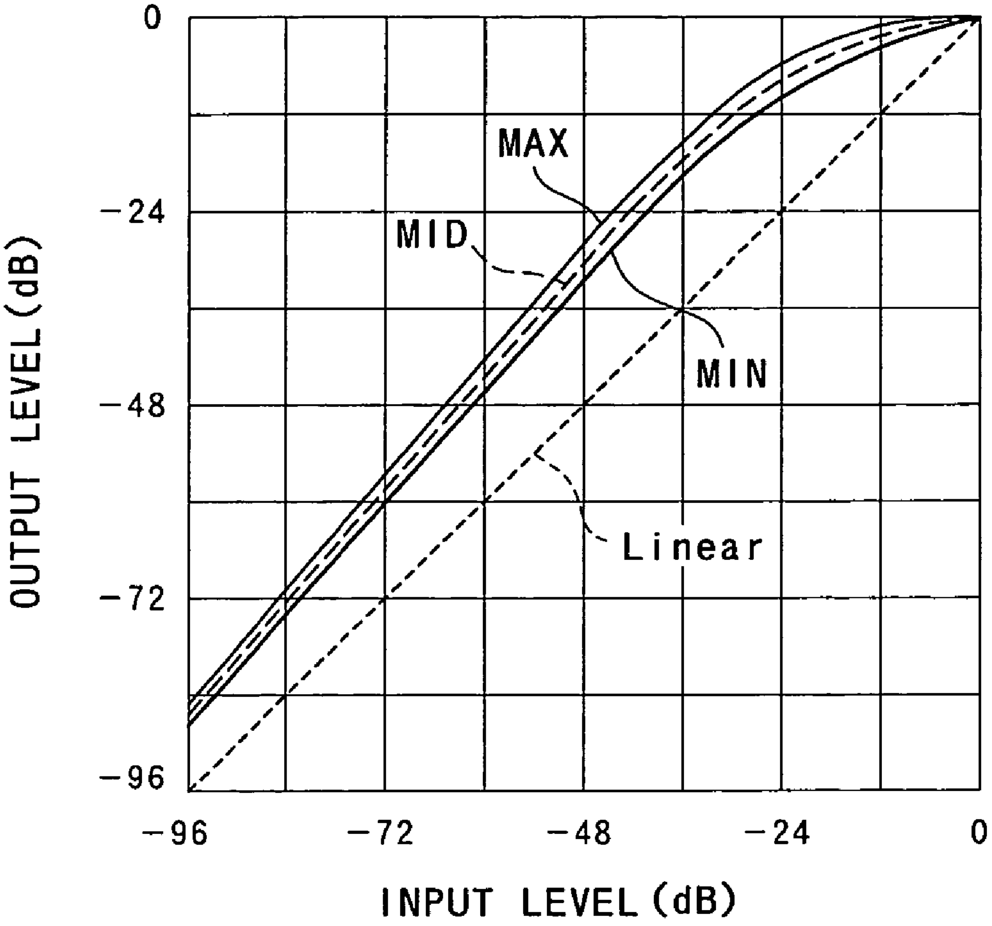
FIG. 9 is a diagram showing example input/output characteristics of a normalization processing circuit in the fourth embodiment.

FIG. 9 shows example input/output characteristics of the normalization processing circuit 13, where the horizontal axis represents the input level detected by the level detection section 15 while the vertical axis represents the output level of the normalization processing circuit 13. Let it be assumed here that a given one of the channels Lch, Rch, Cch, SLch, SRch and LFEch indicates the greatest level, and FIG. 9 shows input/output characteristics for the given channel. As shown, the gain is increased to increase the amplitude when the input sound is of a small volume, but decreased to restrain the amplitude enhancement when the input sound is of a great volume.

As in the case of the bass boost circuit 3 or treble boost circuit 4, a plurality of different kinds of input/output characteristics MIN, MID and MAX of the normalization processing circuit 13 may be prepared in advance, and the user may select any one of the MIN, MID and MAX characteristics. In this case, the gain table 16 includes a plurality of tables corresponding to the plurality of different kinds of input/output characteristics.

The fourth embodiment can provide the following advantageous benefits in addition to those provided by the first embodiment. As described above, the fourth embodiment is characterized in that the dynamic range expansion/contraction is performed on the sound signals of the individual channels using common gain coefficients corresponding to the greatest level among the multi-channel sound signals. Thus, when the sound is of a small-volume, the fourth embodiment can turn up the sound volume to prevent the sound from being hidden behind noise, while, when the sound is of a great volume, the fourth embodiment can turn down the sound volume to prevent the sound from becoming offensive to the ears of the audience.

When audio of a motion picture, music or the like is to be reproduced at night, it is common to turn down the sound reproducing volume, so as not to disturb the neighbors. However, if the reproducing volume is turned down, a reproduced sound tends to be hard to hear when a sound signal supplied from an audio apparatus is of a small volume. If the reproducing volume is turned up, on the other hand, a reproduced sound tends to be too loud when a sound signal supplied from an audio apparatus is of a great volume. However, the fourth embodiment arranged in the above-described manner can not only prevent a sound from becoming hard to hear when the reproducing volume is set at a low level, but also prevent a sound from becoming too loud when the reproducing volume is set at a high level. Further, in some case, the use has to frequently manipulate the volume due to, for example, a difference in sound volume between a TV program and commercial or between sound sources. The fourth embodiment can reduce undesired differences in sound volume due to differences between audio sources etc. and thereby eliminate the need for frequent volume manipulation by the user.

The fourth embodiment has been described above as using common gain coefficients for each of predetermined channels. In an alternative, the level detection section is provided separately for each of the channels, and gain coefficients specific to each of the channels may be supplied to the amplifier 14-L, 14-R, 14-C, 14-SL, 14-SR or 14-LFE. In another alternative, the channels are divided into a plurality of groups and the level detection section is provided for each of the groups, and common gain coefficients may be used for each of the groups. For example, the channels may be divided into a group of the channels Lch and Rch and group of the other channels, or into a group of the channels Lch and Rch, group of only the channel Cch and group of the other channels.

Fifth Embodiment

Figure 10:
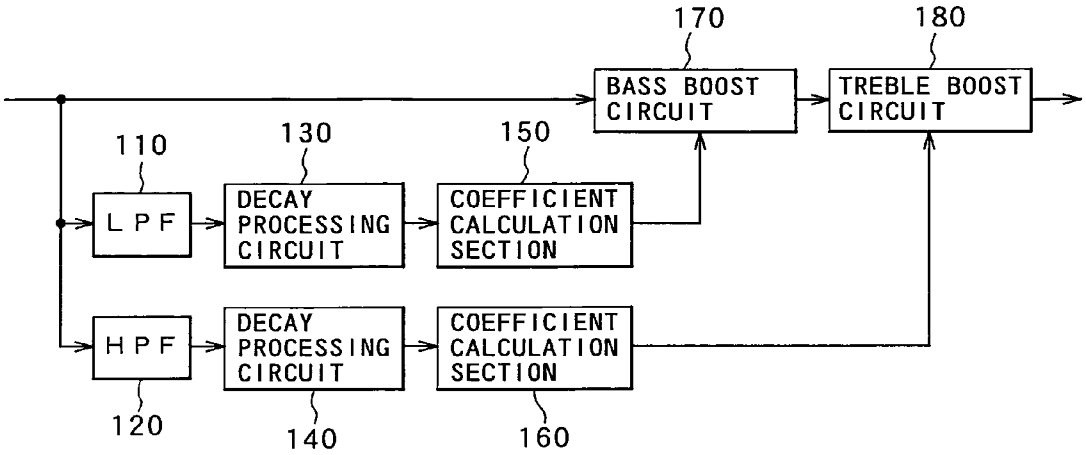
FIG. 10 is a block diagram showing a general setup of a sound quality adjustment device in accordance with a fifth embodiment of the present invention.

FIG. 10 is a block diagram showing a general setup of a sound quality adjustment device in accordance with a fifth embodiment of the present invention. The fifth embodiment includes an LPF 110 functioning as an extraction means or section, an HPF 120 also functioning as an extraction section, decay processing sections 130 and 140, coefficient calculation sections 150 and 160, a bass boost section 170 functioning as a filter processing section, and a treble boost section 180 also functioning as a filter processing section.

Behavior of the quality adjustment device according to the fifth embodiment will be described. The LPF 110, which is in the form of an IIR (Infinite Impulse Response) filter, extracts, from an input sound signal, a sound signal of a bass range lower in frequency than, for example, several hundred Hz. The HPF 120, which is also in the form of an IIR filter, extracts, from the input sound signal, a sound signal of a treble range higher in frequency than, for example, several kHz.

Figure 11:
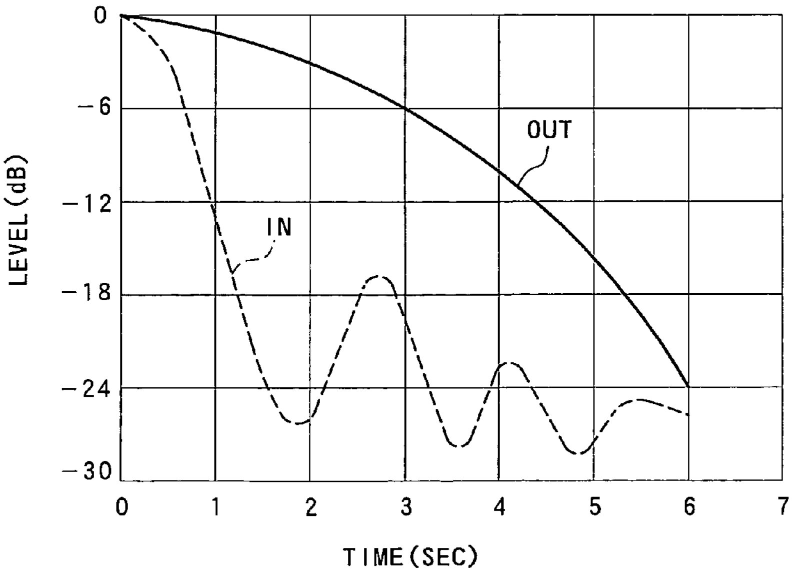
FIG. 11 is a diagram showing example input/output time characteristics of a decay processing section in the fifth embodiment

The decay processing section 130 gradually attenuates the output level in accordance with level lowering of the sound signal of the bass range extracted by the LPF 110, while the decay processing section 140 gradually attenuates the output level in accordance with level lowering of the sound signal of the treble range extracted by the HPF 120. FIG. 11 shows example input/output time characteristics of the decay processing section 130 in the fifth embodiment, where the horizontal axis indicates the time while the vertical axis indicates the level of the sound signal. “IN” indicates the bass-range sound signal extracted by the LPF 110, and “OUT” indicates an output signal of the decay processing section 130.

When an impulse sound signal IN has been input, the decay processing section 130, as illustrated in FIG. 11, gradually attenuates the sound signal over a predetermined release time without causing the level of the output signal OUT to follow the sound signal IN that rapidly decreases in level after assuming a maximum value. In the fifth embodiment, a decay process is performed where a decay rate increases non-linearly in accordance with the passage of time. Thus, a variation in the output level is restrained immediately after an impulse-like variation has occurred in the bass range extracted by the LPF 110, and then, upon lapse of a given time, the decay of the output level is increased, so that the fifth embodiment can give a natural auditory sensation to an audience.

In order to realize such a decay process, the sound signal input to the decay processing section 130 is sampled at predetermined time intervals, and a comparison is made between a sample value at the current time and an output value at the last sampling time so that the higher of the compared two sample values is selected as an output value at the current time. Thus, as the input sound signal level increases, the latest sample value is constantly selected, but, as the input sound signal level decreases, the output value at the last sampling time is selected, in which case the value at the last sampling time is attenuated to be set as the output value at the current time. In this case, the decay rate increases with the passage of time as noted above, and the output value is used, in the level comparison at the next sampling, as the output value of the last sampling time. The other decay processing section 140 is arranged in a similar manner to the decay processing section 130.

The coefficient calculation section 150 calculates a filter coefficient of the bass boost circuit 170 on the basis of the level of the sound signal output from the decay processing section 130. The coefficient calculation section 160, on the other hand, calculates a filter coefficient of the treble boost circuit 180 on the basis of the level of the sound signal output from the decay processing section 140. For the filter coefficient calculation purposes, tables having prestored therein sound signal levels and filter coefficients in association with each other, for example, may be provided in the coefficient calculation sections 150 and 160 so that particular filter coefficients, corresponding to the levels of the sound signals output from the decay processing sections 130 and 140, are read out from the respective tables.

The bass boost circuit 170, which is in the form of a shelving filter, performs a filter process, in accordance with the filter coefficient output from the coefficient calculation section 150, for increasing/decreasing a level of a bass range of the input sound signal lower than a predetermined frequency. Similarly, the treble boost circuit 180, which is also in the form of a shelving filter, performs a filter process, in accordance with the filter coefficient output from the coefficient calculation section 160, for increasing/decreasing a level of a treble range of the input sound signal higher than a predetermined frequency.

Figure 12A:
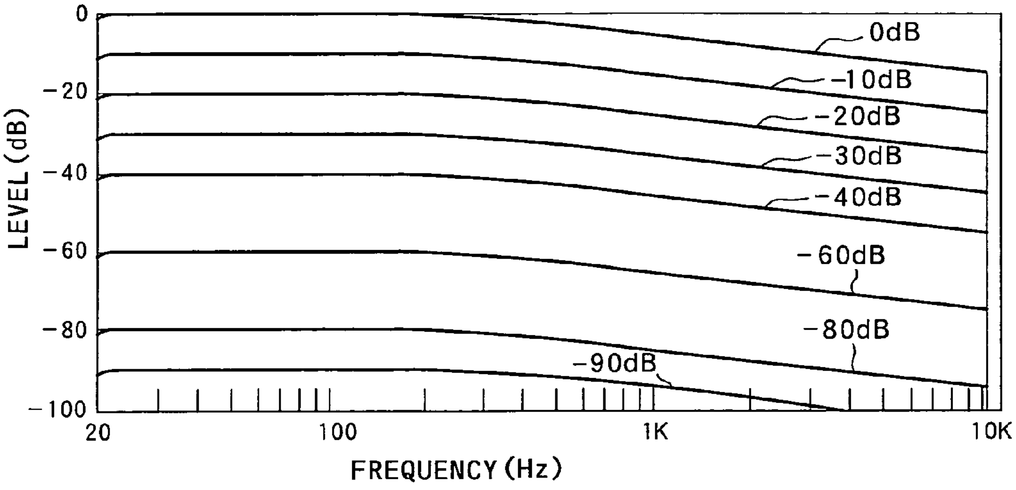
FIGS. 12A and 12B are diagrams showing example frequency characteristics of a bass boost circuit in the fifth embodiment.
Figure 12B:
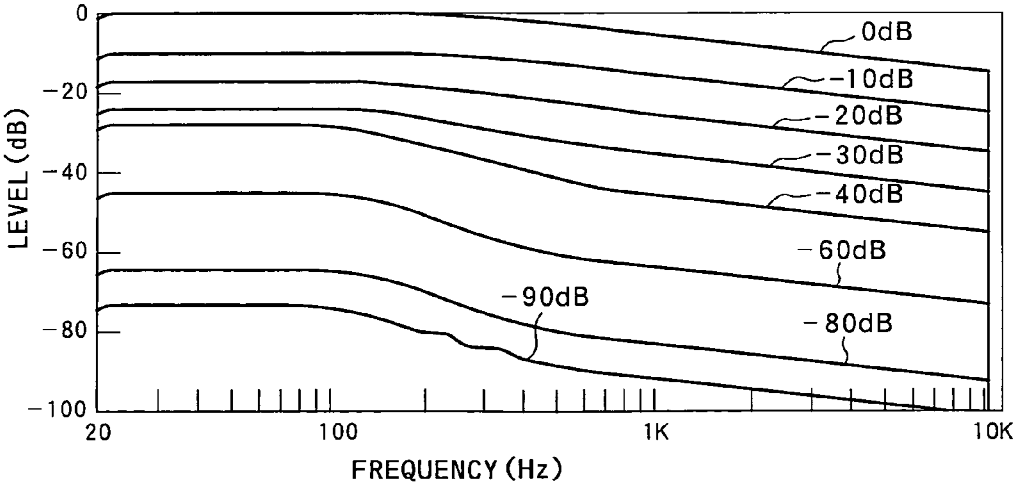

FIGS. 12A and 12B are diagrams showing example frequency characteristics of the bass boost circuit 170 in the fifth embodiment. More specifically, FIG. 12A shows frequency characteristics of a sound signal that is not processed by the bass boost circuit 170, while FIG. 12B shows frequency characteristics of a sound signal that has been processed by the bass boost circuit 170. In each of FIGS. 12A and 12B, the horizontal axis represents the frequency, while the vertical axis represents the sound signal level. Numerical values 0 dB--90 dB indicate input sound signal levels. Through the filter processing by the bass boost circuit 170, as seen from FIG. 12B, the boost amount of the bass range is increased to emphasize bass components when the sound is of a small volume, but the boost amount of the bass range is decreased to restrain the emphasis on the bass range when the sound is of a great volume. The treble boost circuit 180 is arranged, on similar principles to the bass boost circuit 170, to increase/decrease the treble range.

Because the bass components, extracted from the input sound signal, are boosted by the bass boost circuit 170 as set forth above, the fifth embodiment allows the sound volume of the bass range in the overall sound volume to approach a predetermined volume level and can thereby impart the sound with punch even when the sound source has a small quantity of bass components. Similarly, because the treble components, extracted from the input sound signal, are boosted by the treble boost circuit 180, the instant embodiment can impart the sound with modulation even when the sound source has a small quantity of treble components.

Further, because the fifth embodiment employs feed-forward arrangements for changing in real time the filter coefficients of the bass and treble boost circuits 170 and 180 in accordance with the levels of the bass and treble components extracted by the LPF 110 and HPF 1-20 instead of employing feedback of the level of the sound signal having been subjected to the sound quality adjustment, it can rapidly respond to a sound signal level variation, as compared to the conventionally-known sound quality adjustment device shown in FIG. 13. As a result, even when there has been a rapid increase in the input sound signal level, the instant embodiment can promptly restrain the emphasis or boost of the bass and treble components and thereby prevent generation of an unwanted clipping sound.

Further, whereas the fifth embodiment has been described above only in relation to a sound signal of one channel, it may be applied to sound signals of multiple channels. In such a case, the sound quality adjustment device shown in FIG. 10 is provided per channel. Furthermore, the sound quality adjustment need not be performed for all of the channels; it may be performed for at least one of the channels. For example, in a 5.1 channel surround system, it is only necessary to perform the sound quality adjustment separately only for each of three channels: front left channel (Lch); front right channel (Rch); and center channel (Cch).

The sound quality adjustment may be performed separately for each of the channels, in which case same or common gain coefficients are used for these channels. In the case where common gain coefficients are used for the channels, the coefficient calculation section 150 in the bass boost circuit 170 of each of the sound quality adjustment devices for the channels Lch, Rch and Cch may calculate a coefficient corresponding to the greatest level among bass components of three sound signals of the channels Lch, Rch and Cch extracted by the corresponding LPF 110. Thus, in the case where the sound quality adjustment is to be performed for the three channels Lch, Rch and Cch, the same coefficient calculation section can be shared among the respective (i.e., three) bass boost circuits 170 although the sound quality adjustment device has to be provided for each of the channels Lch, Rch and Cch; in this way, the overall circuitry size can be reduced.

The present invention arranged in the above-described manner can be suitably applied to audio apparatus and TV receivers.

What is claimed is:

1. A sound quality adjustment device comprising, for at least one of sound signals of multiple channels;

a filter circuit that extracts a sound signal of a predetermined frequency band from an input sound signal;

a boost circuit that performs dynamic range expansion/contraction on the sound signal, extracted by said filter circuit, in accordance with an input level of the sound signal;

an adder that adds together the input sound signal and the sound signal outputted by said boost circuit; and a decay processing circuit provided between said filter circuit and said boost circuit, said decay processing circuit gradually attenuating an output level in accordance with lowering of the level of the sound signal extracted by said filter circuit, said decay processing circuit sampling an input sound signal at predetermined time intervals, comparing a sample value at the current time with an output value at the last sample time, and selecting the higher of the compared two sample values as an output value at the current time, so that, when the output value at the last sample time decreases, the value at the last sampling time is attenuated at a decay rate which increases with the passage of time and is set as the output value at the current time.

2. A sound quality adjustment device as claimed in claim 1 which further comprises, for the at least one sound signal, a subtracter that subtracts the sound signal, extracted by said filter circuit, from the input sound signal, and wherein said adder adds together the subtracted input sound signal and the sound signal outputted by said boost circuit.

3. A sound quality adjustment device comprising, for at least one of sound signals of multiple channels;

an extraction section that extracts a sound signal of a predetermined frequency band from an input sound signal;

a coefficient calculation section that calculates a filter coefficient on the basis of a level of the sound signal extracted by said extraction section;

a filter processing section that, in accordance with the filter coefficient calculated by said coefficient calculation section, performs a filter process for increasing/decreasing the level of the sound signal of the predetermined frequency band of the input sound signal and outputs the filter processed input sound signal as an output sound signal on which sound quality adjustment has been made; and feed forward means for changing the filter coefficient of the filter processing section in real time in accordance with the level of the sound signal which has been detected by said extraction section, wherein the filter processing section is disposed in a signal path between the input sound signal and the output sound signal, and the extraction section is not disposed in the signal path between the input sound signal and the output sound signal.

4. A sound quality adjustment device as claimed in claim 3 which further comprises, for the at least one sound signal, a decay processing section provided between said extraction section and said coefficient calculation section, said decay processing section gradually attenuating an output level in accordance with lowering of the level of the sound signal extracted by said extraction section.

5. A sound quality adjustment device as claimed in claim 3, wherein the extraction section includes a low pass filter and a high pass filter which are coupled in parallel with each other relative to the input sound signal, the coefficient calculation section includes a bass coefficient calculation section coupled to the low pass filter for calculating bass boost filter coefficients and a treble coefficient calculation section coupled to the high pass filter for calculating treble boost filter coefficients, and the filter processing section includes a bass boost circuit which receives the bass boost filter coefficients and a treble boost circuit which receives the treble boost filter coefficients.

* * * * *